US 8,904,161 B2

(12) United States Patent
Shim et al.

(10) Patent No.: US 8,904,161 B2
(45) Date of Patent: Dec. 2, 2014

(54) MEMORY SYSTEM AND RESET METHOD THEREOF TO PREVENT NONVOLATILE MEMORY CORRUPTION DUE TO PREMATURE POWER LOSS

(75) Inventors: Hojun Shim, Yongin-si (KR); Woo-Sung Cho, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 103 days.

(21) Appl. No.: 13/239,454

(22) Filed: Sep. 22, 2011

(65) Prior Publication Data

US 2012/0102310 A1 Apr. 26, 2012

Related U.S. Application Data

(60) Provisional application No. 61/394,988, filed on Oct. 20, 2010.

(51) Int. Cl.
*G06F 9/00* (2006.01)
*G11C 5/14* (2006.01)
*G11C 16/22* (2006.01)

(52) U.S. Cl.
CPC ............... *G11C 16/22* (2013.01); *G11C 5/143* (2013.01)
USPC ................................. 713/2; 714/14

(58) Field of Classification Search
USPC ......... 713/1, 2, 100, 300, 310, 320, 321, 322, 713/323, 324, 330, 340, 375
See application file for complete search history.

(56) References Cited

U.S. PATENT DOCUMENTS

| 4,677,311 | A | * | 6/1987 | Morita | 307/66 |
| 5,212,797 | A | * | 5/1993 | Miyake et al. | 714/14 |
| 6,226,556 | B1 | * | 5/2001 | Itkin et al. | 700/21 |
| 6,847,192 | B2 | * | 1/2005 | Turner et al. | 320/166 |
| 2004/0250149 | A1 | * | 12/2004 | Tsai et al. | 713/330 |
| 2005/0024968 | A1 | * | 2/2005 | Lee et al. | 365/218 |
| 2007/0236262 | A1 | * | 10/2007 | McClure | 327/108 |
| 2008/0197913 | A1 | * | 8/2008 | Chao | 327/541 |

FOREIGN PATENT DOCUMENTS

| JP | 05-333965 | 12/1993 |
| JP | 10-055228 | 2/1998 |
| JP | 2004-356813 | 12/2004 |

* cited by examiner

*Primary Examiner* — Paul Yanchus, III
*Assistant Examiner* — Paul J Yen
(74) *Attorney, Agent, or Firm* — Ellsworth IP Group PLLC

(57) ABSTRACT

Provided is a memory system that includes at least one nonvolatile memory device, a plurality of power lines and a plurality of power domains. The power lines receive a power source voltage. The power domains are respectively connected to the power lines. A reset signal is generated by using voltages which are detected from the power lines. The memory system and a reset method thereof detect the voltages of all power lines to generate a reset signal, and thus enhance reliability of data when a power is shut off.

18 Claims, 9 Drawing Sheets

MEMORY SYSTEM AND RESET METHOD THEREOF TO PREVENT NONVOLATILE MEMORY CORRUPTION DUE TO PREMATURE POWER LOSS

CROSS-REFERENCE TO RELATED APPLICATIONS

This application claims priority under 35 U.S.C. §119 from U.S. Provisional Patent Application No. 61/394,988 filed on Oct. 20, 2010 in the U.S. Patent and Trademark Office, the disclosure of which is incorporated herein in their entirety by reference.

BACKGROUND

1. Field of the General Inventive Concept

The present disclosure herein relates to a memory system and a reset method thereof.

2. Description of the Related Art

User devices include electronic devices such as personal computers, digital cameras, camcorders, portable telephones, MP3 players, Portable Multimedia Players (PMPs) and Personal Digital Assistants (PDAs), and electronic devices such as memory cards, Universal Serial Bus (USB) memories and Solid State Drivers (SSDs). Most of the user devices internally include memory devices to store data. Memory devices can be volatile and include memories such as Dynamic Random Access Memory (DRAM) and Static Random Access Memory (SRAM). Memory devices can also be nonvolatile and include memories such as Electrical Erasable Programmable Read Only Memory (EEPROM), Ferroelectric Random Access Memory (FRAM), Phase-change Random Access Memory (PRAM), Magnetoresistive Random Access Memory (MRAM) and flash memory. The volatile memories lose stored data when a power is shut off, but the nonvolatile memories retain data even when a power is shut off. However, if nonvolatile memories are shut off prematurely or lose power while being accessed, memory data can be corrupted or improperly read, causing data errors.

SUMMARY

The present disclosure provides a memory system and a reset method thereof, which enhance reliability of data.

Additional features and utilities of the present general inventive concept will be set forth in part in the description which follows and, in part, will be obvious from the description, or may be learned by practice of the general inventive concept.

Embodiments of the general inventive concept may be achieved by providing a memory system, which includes at least one nonvolatile memory device, including a plurality of power lines to receive a power source voltage, and a plurality of power domains respectively connected to the power lines, wherein a reset signal is generated by using voltages which are detected from the power lines.

In some embodiments, the memory system may further include a reset signal generator to generate the reset signal when at least one of the detected voltages is lower than a predetermined voltage.

In other embodiments, the memory system may further include a plurality of voltage detectors to respectively detect the power lines.

In still other embodiments, each of the voltage detectors may include a CMOS transistor.

In even other embodiments, each of the voltage detectors may include an open-drain transistor.

In yet other embodiments, the reset signal may be generated by connecting the detected result values outputted from the voltage detectors by wired-OR circuitry.

In further embodiments, at least one of the power domains may include a Central Processing Unit (CPU) to perform a reset operation in response to the reset signal.

In still further embodiments, the memory system may further include an external power source to receive an external power to supply the power source voltage to the power lines.

In even further embodiments, the memory system may further include a battery to auxiliary supply the power source voltage to the power lines.

In yet further embodiments, the memory system may further include an auxiliary power supply to receive the power source voltage from the external power source to supply the power source voltage to the power lines.

In yet further embodiments, the auxiliary power supply may include a charge cell array including at least one charge cell which charges electric charges, a power charger to receive the power source voltage from the external power source to charge the electric charges in the charge cell array, and a power booster to boost an output voltage of the charge cell array to the power source voltage.

In much further embodiments, the at least one charge cell may be a super capacitor which charges large-scale electric charges.

In still much further embodiments, the power charger may include an output terminal including a one-way device.

Embodiments of the general inventive concept may also be achieved by providing a memory system, which includes at least one nonvolatile memory device, includes a plurality of power domains to receive a power source voltage through a plurality of power lines, respectively, an auxiliary power supply to supply the power source voltage to the power lines when a power is shut off, and a plurality of voltage detectors to respectively detect voltages of the power lines, wherein at least one of the power domains includes a Central Processing Unit (CPU) to perform a reset operation in response to a reset signal, and the reset signal is generated by using the voltages which are detected by the voltage detectors.

In some embodiments, the auxiliary power supply may include a super capacitor array including at least one serially-connected super capacitors, a super capacitor charger to charge the super capacitor array, and a super capacitor booster to boost an output voltage of the super capacitor array to the power source voltage, and to supply the boosted power source voltage to the power lines.

In other embodiments, the output voltage of the super capacitor array may be equal to or lower than about 3.6 V.

In still other embodiments, each of the power domains may include at least one driving regulator to receive the power source voltage from a corresponding power line to generate at least one driving voltage to drive of an internal device which is included in a power domain.

In even other embodiments, the memory system may further include a plurality of NAND flash memory devices storing data, wherein the NAND flash memory devices are divided into at least two groups among the power domains.

In still other embodiments of the general inventive concept, a reset method of a memory system, which includes at least one nonvolatile memory device and at least one Central Processing Unit (CPU), includes detecting voltages of a plurality of power lines which are respectively connected to a plurality of power domains, generating a reset signal when at least one of the detected voltages is lower than a predetermined voltage, and resetting the CPU in response to the reset signal.

In some embodiments, the reset signal may be used for a sudden power-off recovery operation of the at least one non-volatile memory device.

Embodiments of the present general inventive concept may also be achieved by providing a memory system including at least one power source to supply power to the memory system, a plurality of voltage detectors to detect a voltage level output from the at least one power source via a plurality of power lines, a first power domain including a non-volatile memory device, and a second power domain including a processor to control the operation of the non-volatile memory device depending on the detected voltage level from at least one of the plurality of voltage detectors.

The memory system of claim may include at least one of the plurality of voltage detectors outputs a reset signal to the processor when power output from the at least one power source is below a first predetermined level.

At least one of the plurality of voltage detectors may output a voltage low (VLow) signal to the processor when power output from the at least one power source is below a second predetermined level and higher than the first predetermined level.

The memory system may include a second power source to supply power to the memory system after the at least one of the plurality of voltage detectors outputs the VLow signal.

The memory system may include logic circuitry to connect the plurality of voltage detectors and the processor, wherein the plurality of voltage detectors each output respective reset signals via the logic circuitry.

The logic circuitry may be OR circuitry.

The logic circuitry may be AND circuitry.

BRIEF DESCRIPTION OF THE DRAWINGS

The accompanying drawings are included to provide a further understanding of the general inventive concept, and are incorporated in and constitute a part of this specification. The drawings illustrate exemplary embodiments of the general inventive concept and, together with the description, serve to explain principles of the general inventive concept. In the drawings.

DETAILED DESCRIPTION OF THE PREFERRED EMBODIMENTS

Exemplary embodiments of the general inventive concept will be described below in more detail with reference to the accompanying drawings. The general inventive concept may, however, be embodied in different forms and should not be construed as limited to the embodiments set forth herein. These embodiments are provided so that this disclosure will be thorough and complete, and will fully convey the scope of the general inventive concept to those skilled in the art.

Figure 1:
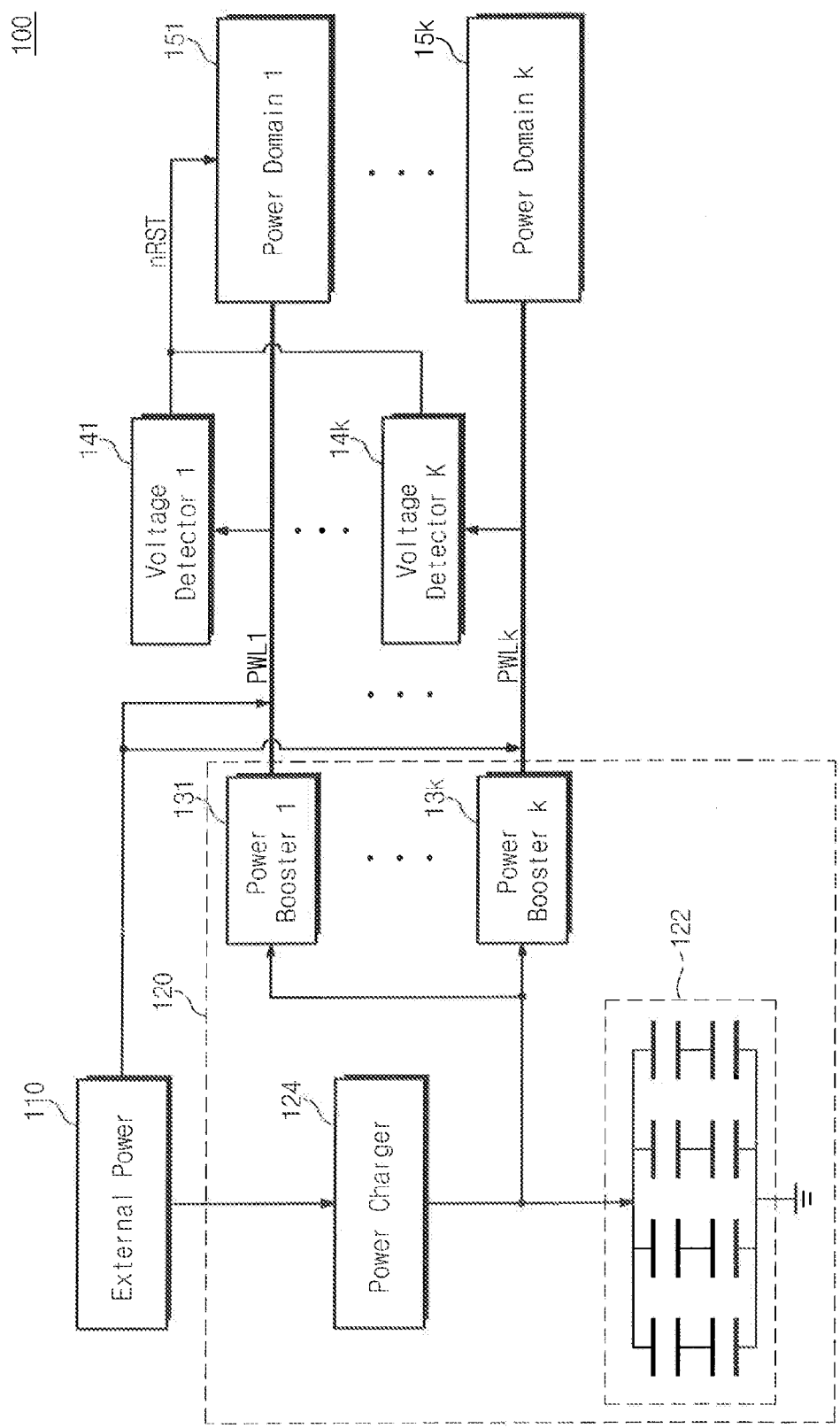
FIG. 1 is a block diagram illustrating a memory system according to a first embodiment of the general inventive concept.

FIG. 1 is a block diagram illustrating a memory system according to a first embodiment of the general inventive concept.

Referring to FIG. 1, a memory system 100 according to a first embodiment of the general inventive concept includes an external power source 110, an auxiliary power supply 120, a plurality of voltage detectors 141 to 14$k$, and a plurality of power domains 151 to 15$k$. Herein, k is an integer equal to or more than two.

The external power source 110 may receive a Direct Current (DC) power or an Alternating Current (AC) power from the outside to supply a power to a plurality of power lines PWL1 to PWLk or the auxiliary power supply 120. The AC or DC power received may be converted or stepped down to a DC voltage usable by the components of the memory system 100.

The auxiliary power supply 120 receives power from the external power source 110 to charge at least one charge cell, and auxiliary supplies power, which is outputted from at least one charge cell, to the power lines PWL1 to PWLk.

The auxiliary power supply 120 may include a charge cell array 122, a power charger 124, and a plurality of power boosters 131 to 13$k$.

The charge cell array 122 may include at least one charge cell. In a first embodiment of the general inventive concept, the charge cell may be a super capacitor. Herein, the super capacitor may charge large-scale electric charges. The charge cell array 122 of FIG. 1 may have a structure in which four pairs of two serially-connected charge cells are connected in parallel. However, the general inventive concept is not limited thereto. The charge cell array 122 may include at least one serially-connected charge cell. Also, the charge cell array 122 may have a structure in which serially-connected cells are connected in parallel.

The power charger 124 receives power from the external power source 110 to supply power to the power lines PWL1 to PWLk and to charge the charge cell array 122. That is, the power charger 124 may supply an electric charge to the charge cell array 122. The power charger 124 may include an internal power supply (not illustrated). In this case, the power charger 124 may charge the charge cell array 122 with the internal power supply. The power charger 124 may include a plurality of output terminals having a one-way device (not illustrated). Herein, the one-way devices may prevent the reverse flow of a current or a voltage that is outputted from the power charger 124. In a first embodiment of the general inventive concept, the one-way devices may be diodes.

Within the auxiliary power supply 120, each of the power boosters 131 to 13$k$ may receive and boost the output voltage of the charge cell array 122, and supply the boosted voltage to a respective power line among the power lines PWL1 to PWLk. Power is supplied from the auxiliary power supply 120 to supplement a power decrease, loss or shut down from the external power source 110. The output terminal of each of the power boosters 131 to 13k includes a one-way device such as a diode (not illustrated).

The auxiliary power supply 120 may further include a cell balancing circuit (not illustrated) to prevent the deterioration of the charge cells of the charge cell array 122 and extend the service life of the charge cells of the charge cell array 122. Herein, the cell balancing circuit may be implemented with a passive device or an active device.

Each of the voltage detectors 141 to 14k detects whether the voltage of a respective power line among the power lines PWL1 to PWLk decreases to less than a predetermined value. Voltages detected by the voltage detectors 141 to 14k are connected by wired-OR circuitry, to thereby generate a reset signal nRST to be output to a CPU of a power domain. Herein, the reset signal nRST may be a power-off reset signal POR. The POR may signal the CPU to turn off write and read operations of other circuits that are in the process of accessing memory devices of the power domains. In a first embodiment of the general inventive concept, each of the voltage detectors 141 to 14k may be implemented with CMOS transistors to control logic, memory and switching functions. In another embodiment of the general inventive concept, each of the voltage detectors 141 to 14k may be implemented with open-drain transistors to perform the same.

In FIG. 1, the voltage-detected result values of the voltage detectors 141 to 14k are connected by wired-OR circuitry, to thereby generate a reset signal nRST. However, the generation of reset signal nRST according to a first embodiment of the general inventive concept is not limited thereto. In a first embodiment of the general inventive concept, the memory system 100 may include other logic circuits (for example, AND, OR, NOT, NAND, NOR or the like) that generate the reset signal nRST using the voltage-detected result values of the voltage detectors 141 to 14k.

Each of the power domains 151 to 15k receives a power from a corresponding power line among the power lines PWL1 to PWLk. Each of the power domains 151 to 15k may include at least one internal device using supplied power. Herein, the at least one internal devices of the power domains 151 to 15k may be a voltage regulator, a Central Processing Unit (CPU), a DRAM, a NAND, a temperature sensor or an analog-to-digital converter.

At least one of the power domains 151 to 15k includes a nonvolatile memory device to store data.

When a voltage detector 141 detects that power being transferred along power line PWL1 is below a predetermined voltage, first power domain 151 receives the reset signal nRST generated by the voltage detector 141. The first power domain 151 includes a device (for example, CPU) that performs a reset operation in response to the reset signal nRST. The reset operation may include many different functions including the cessation of reading or writing to a memory cell or cells in the first power domain 151 and/or other power domains. In FIG. 1, the reset signal nRST is inputted to the first domain 151. However, the general inventive concept is not limited thereto. In a first embodiment of the general inventive concept, the reset signal nRST may be inputted to at least one power domain.

The memory system 100 according to a first embodiment of the general inventive concept includes the power detectors 141 to 14k that respectively detect the voltages of the power lines PWL1 to PWLk.

When a voltage level is at or above a predetermined voltage, voltage detectors $14_1$ to $14_k$ do not send the signal nRST to the power domains. However, when a voltage level detected by the voltage detectors 141 to 14k is less than a predetermined voltage, the signal nRST is generated and sent. Depending on the type of logic circuitry (OR, AND, NOR, NAND, NOT, etc.) used by the voltage detectors 141 to 14k, the nRST signal sent to a CPU of a power domain may vary depending on different power levels of the various power lines PWL1 to PWLk.

For example, the memory system 100 may connect the voltage-detected result values of the power detectors 141 to 14k by wired-OR circuitry, thereby generating the reset signal nRST.

Using OR circuitry as connected in FIG. 1, if a single voltage detector 141 to 14k detects that a voltage of a power line PWL1 to PWLk has fallen below the predetermined voltage level, representing a logic "1," the reset signal nRST generated by the respective voltage detector will be output to the CPU of the power domain.

A time taken for the memory system 100 to generate the reset signal nRST is lower, and thus is generated more quickly, than the time taken for the external power source 110 and auxiliary power supply 120 to shut off. Since voltage detectors 141 to 14k detect when an output voltage is below a predetermined level, a signal is transmitted to the CPU to cease operations of the power domains before total power is lost. Thus, the generation and transmission of the reset signal nRST can enhance reliability relevant to Sudden Power-Off Recovery (SPOR).

In FIG. 1, the memory system 100 includes the voltage detectors 141 to 14k to respectively detect the voltages of the power lines PWL1 to PWLk. However, the general inventive concept is not necessarily required to include the voltage detectors 141 to 14k. In a first embodiment of the general inventive concept, the memory system 100 may include a reset signal generator that detects the voltages of the power lines PWL1 to PWLk and generates the reset signal nRST with the detected result.

Figure 2:
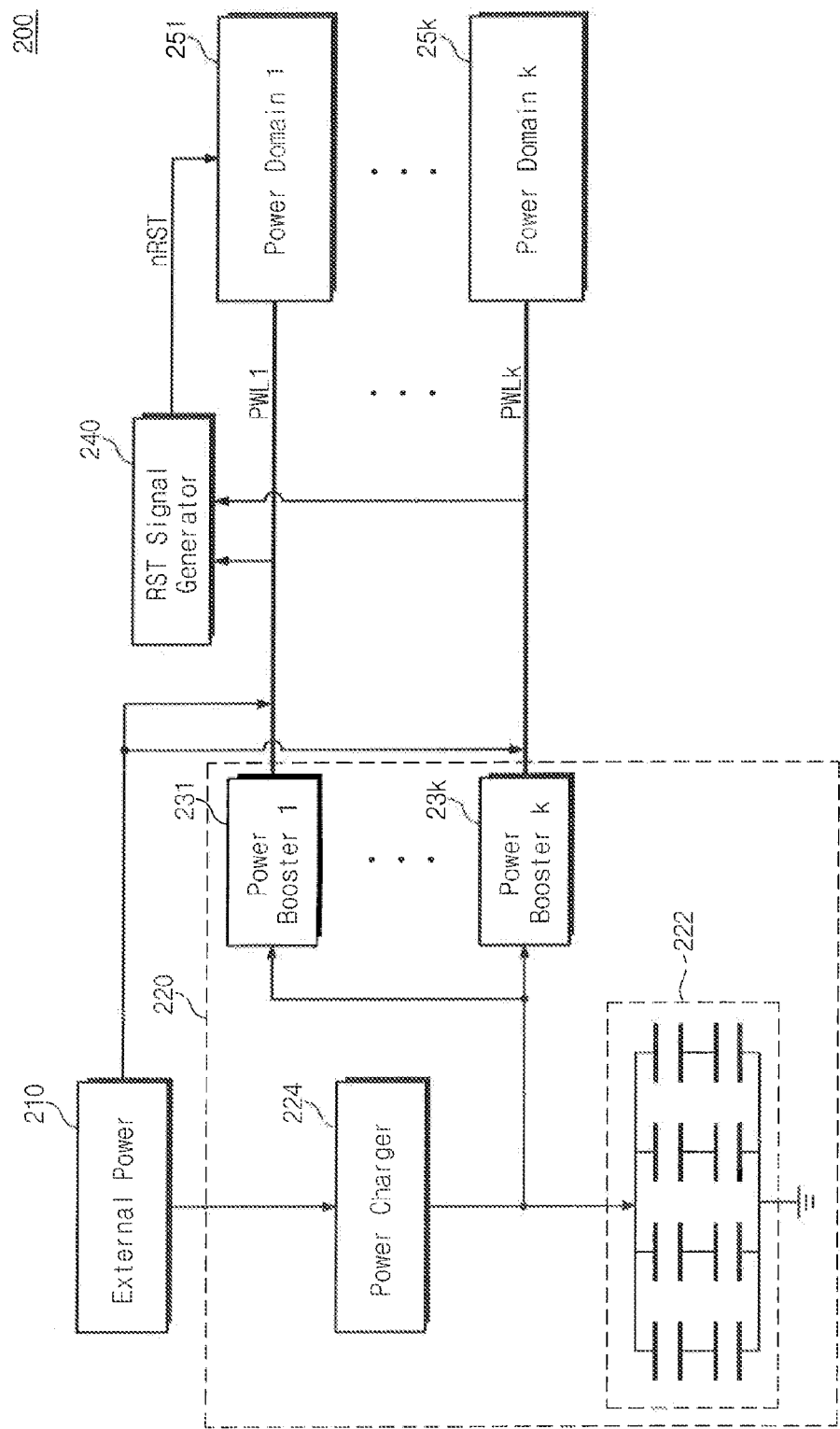
FIG. 2 is a block diagram illustrating a memory system according to a second embodiment of the general inventive concept.

FIG. 2 is a block diagram illustrating a memory system according to a second embodiment of the general inventive concept.

Referring to FIG. 2, a memory system 200 according to a second embodiment of the general inventive concept includes an external power source 210, an auxiliary power supply 220, a reset signal generator 240, and a plurality of power domains 251 to 25k. Herein, k is an integer equal to or more than two. The configuration and operation of the external power source 210 is the same as those of the external power source 110 of FIG. 1. The configuration and operation of the auxiliary power supply 220 is the same as those of the auxiliary power supply 120 of FIG. 1. The configuration and operation of each of the power domains 251 to 25k is the same as those of each of the power domains 151 to 15k of FIG. 1.

The reset signal generator 240 detects the voltages of power lines PWL1 to PWLk, and generates a reset signal nRST when at least one of the detected voltages decreases to less than a predetermined value.

In FIGS. 1 and 2, the memory systems 100 and 200 use voltages, which are outputted from the auxiliary power supplies 120 and 220, as auxiliary powers, respectively. However, the general inventive concept is not limited thereto. The memory systems according to embodiments of the general inventive concept may use voltages, which are supplied from all power supplies other than an external power source, as auxiliary powers in various schemes. For example, each of the memory systems according to embodiments of the general inventive concept may receive an auxiliary power from a battery.

Figure 3:
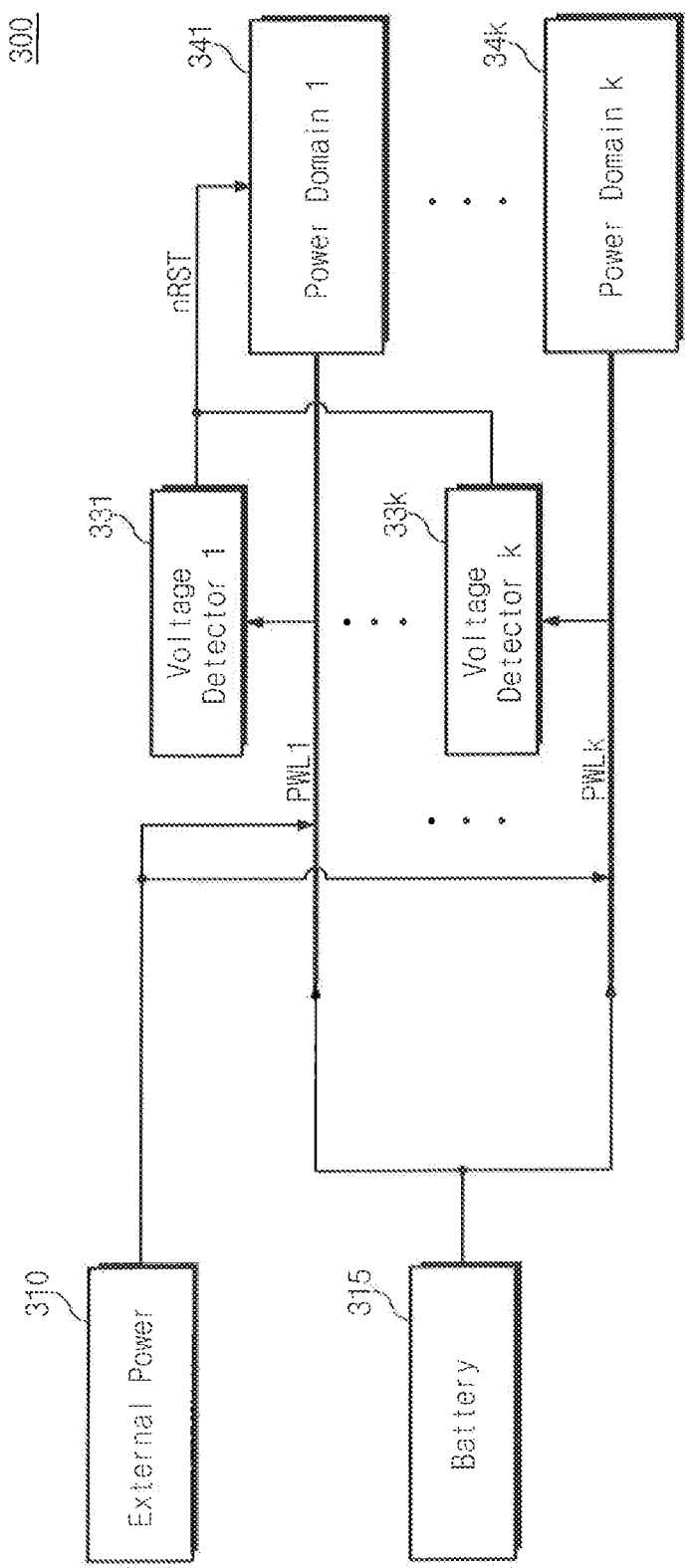
FIG. 3 is a block diagram illustrating a memory system according to a third embodiment of the general inventive concept.

FIG. 3 is a block diagram illustrating a memory system according to a third embodiment of the general inventive concept.

Referring to FIG. 3, a memory system 300 according to a third embodiment of the general inventive concept includes an external power source 310, a battery 315, a plurality of voltage detectors 331 to 33$k$, and a plurality of power domains 341 to 34$k$. Herein, k is an integer equal to or more than two.

A plurality of power lines PWL1 to PWLk receive a power from the external power source 310 or receive an auxiliary power from the battery 315.

Each of the voltage detectors 331 to 33$k$ detects the voltage of a corresponding power line among the power lines PWL1 to PWLk, and thus monitors whether an auxiliary power is normally supplied from the battery 315 when the external power source 310 is shut off. When the auxiliary power is not normally supplied to at least one of the power lines PWL1 to PWLk, a reset signal nRST is generated.

The memory system 300 according to a third embodiment of the general inventive concept may receive an auxiliary power from an auxiliary power source or a battery.

Figure 4:
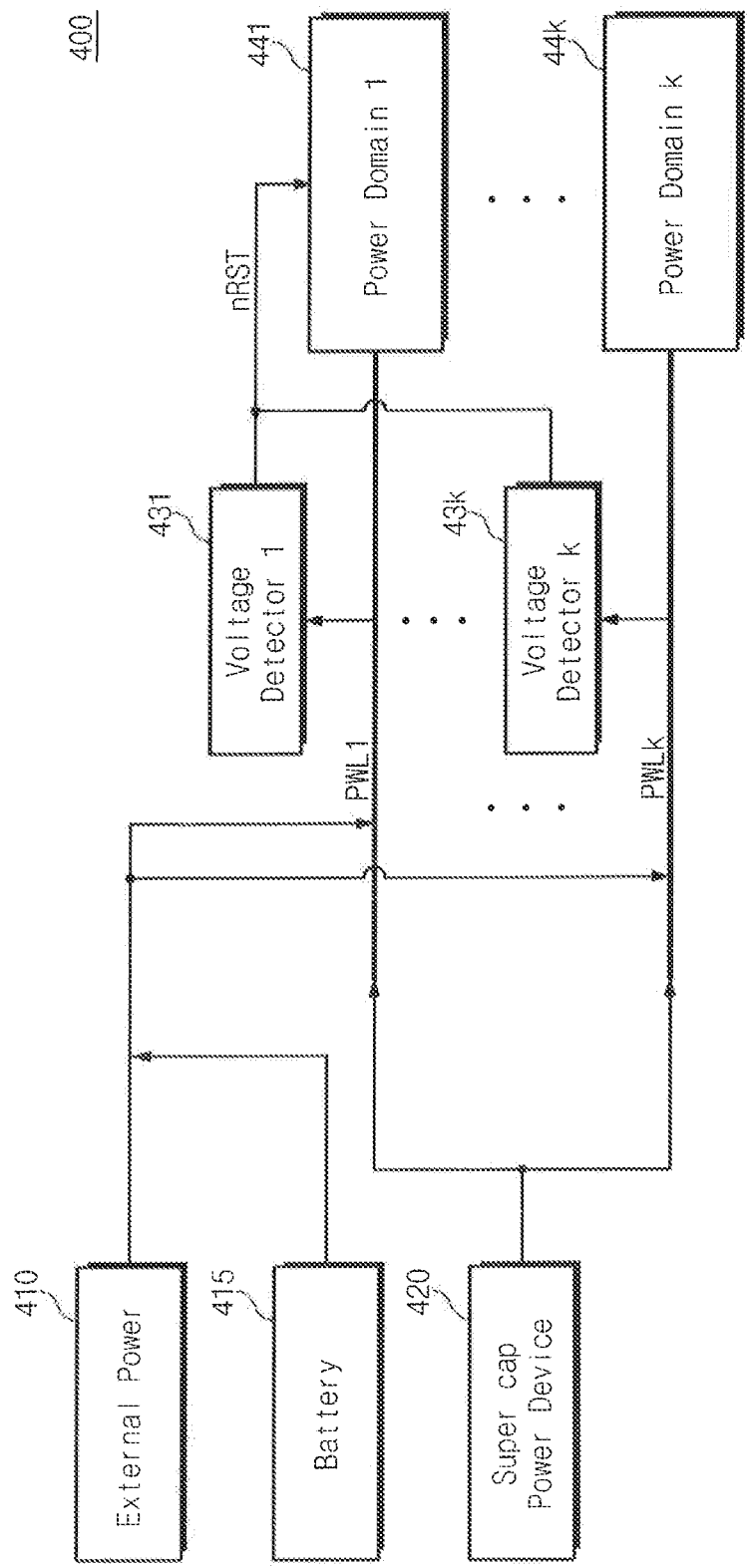
FIG. 4 is a block diagram illustrating a memory system according to a fourth embodiment of the general inventive concept.

FIG. 4 is a block diagram illustrating a memory system according to a fourth embodiment of the general inventive concept.

Referring to FIG. 4, a memory system 400 according to a fourth embodiment of the general inventive concept includes an external power source 410, a battery 415, a super capacitor power supply 420, a plurality of voltage detectors 431 to 43$k$, and a plurality of power domains 441 to 44$k$. Herein, k is an integer equal to or more than two. The super capacitor power supply 420 includes at least one super capacitor that supplies a power to a plurality of power lines PWL1 to PWLk when the external power source 410 is shut off or is decreased to a second predetermined level to trigger the activation of the battery 415 and/or super capacitor power supply 420.

Therefore, when a voltage level output from external power source 410 is lower than a second predetermined level, which is greater than the first predetermined level, a low voltage VLow signal is output by at least one of the voltage detectors 431 to 43$k$ to a CPU 553 (illustrated in FIG. 6, for example) of the power domain 1. Upon receiving this signal, the CPU controls the battery 415 to switch on and to supply power to the power lines PWL1 to PWLk to increase the output voltage to or above the second predetermined level.

When voltage levels from the combined external power source 410 and battery 415 fall below the second predetermined level, a second VLow signal may be generated by at least one of voltage detectors 431 to 43$k$ to the CPU of the power domain 441. Upon receiving this second signal, the CPU may control the super capacitor power device 420 to turn on and supplement the decreasing power of external power source 410 and battery 415 to rise to or above the second predetermined level.

If after a period of time, the external power source 410 remains diminished or off, and the battery 415 and super capacitor power device 420 cannot maintain the power in the power lines PWL1 to PWLk at or above the second predetermined voltage and the first predetermined voltage, then the voltage detectors 431 to 43$k$ generate and transmit the reset signal nRST to the power domain that includes the CPU. Upon receiving the nRST reset signal, the CPU may cease all reading to and/or writing from NAND flash memory or memories. This cessation of read and write actions by the CPU is preventative, and performed to avoid a loss of power that could damage data during interrupted write or read processes of the memory system.

Thus, the power lines PWL1 to PWLk may receive a power from the external power source 410, receive an auxiliary power from the battery 415, or receive an auxiliary power from the super capacitor power supply 420.

Each of the voltage detectors 431 to 43$k$ detects the voltage of a corresponding power line among the power lines PWL1 to PWLk, and thus monitors whether an auxiliary power is normally supplied at or above the second predetermined voltage level from the battery 315 or the super capacitor power supply 420 when the external power source 410 is shut off. When the auxiliary power is not normally supplied to at least one of the power lines PWL1 to PWLk, a reset signal nRST is generated.

Figure 5:
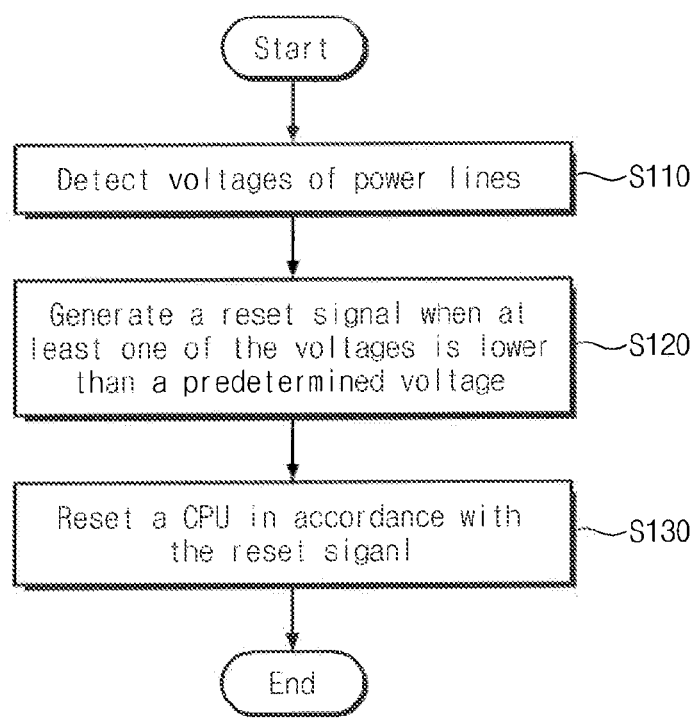
FIG. 5 is a flowchart illustrating a reset method of memory system according to an embodiment of the general inventive concept.

FIG. 5 is a flowchart illustrating a reset method of a memory system according to an embodiment of the general inventive concept.

Referring to FIG. 5, a reset method of a memory system according to an embodiment of the general inventive concept is as follows. Herein, the memory system may be any one of the memory system 100 of FIG. 1, the memory system 200 of FIG. 2, the memory system 300 of FIG. 3 and the memory system 400 of FIG. 4.

The voltages of the power lines PWL1 to PWLk respectively supplying power to the power domains 151 to 15$k$ are detected in operation S110. When at least one of the detected voltages is lower than a predetermined voltage, the reset signal nRST is generated in operation S120. In response to the reset signal nRST, a CPU is reset in operation S130. Herein, the CPU is included in the first power domain 151. The CPU being reset may represent a plurality of different actions to be taken by the CPU, including cessation of the writing to or reading from a plurality of NAND flash memory cells.

The reset method of a memory system according to an embodiment of the general inventive concept detects the voltages of the power lines PWL1 to PWLk respectively supplying power to the power domains 151 to 15$k$ such that the reset signal nRST may be generated.

The memory systems according to embodiments of the general inventive concept may be applied to Solid State Drivers (SSDs).

Figure 6:
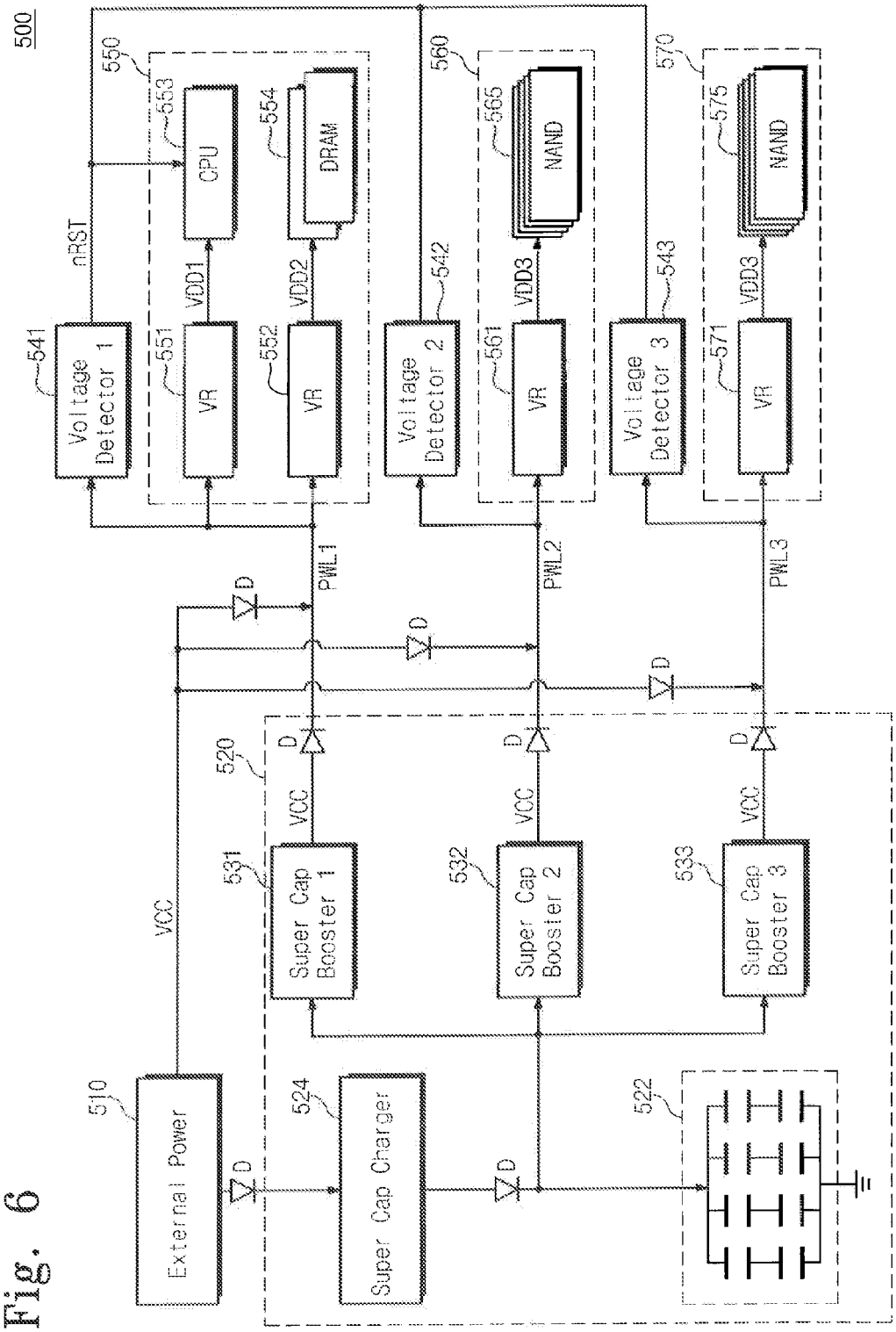
FIG. 6 is a block diagram illustrating an SSD according to an embodiment of the general inventive concept.

FIG. 6 is a block diagram illustrating an SSD 500 according to an embodiment of the general inventive concept.

Referring to FIG. 6, an SSD 500 according to an embodiment of the general inventive concept includes an external power source 510, an auxiliary power supply 520, a plurality of voltage detectors 541 to 543, and a plurality of power domains 550, 560 and 570.

The external power source 510 receives a power from outside of the SSD 500 to supply a power source voltage VCC to power lines PWL1 to PWL3 or the auxiliary power supply 520. In an embodiment of the general inventive concept, the power source voltage VCC may be about 5 V. The output terminal of the external power source 510 includes a one-way device D. Herein, the one-way device D may be a diode. The same voltage level VCC may be supplied to each of the power lines PWL1 to PWL3 as a result of a parallel configuration between the external power supply 510 and power domains 550, 560 and 570.

The auxiliary power supply 520 auxiliary supplies the power source voltage VCC to the power lines PWL1 to PWL3 when the external power source 510 is shut off or decreased below a second predetermined level. The auxiliary power supply 520 includes a super capacitor array 522, a super capacitor charger 524, and a plurality of super capacitor boosters 531 to 533.

The super capacitor array 522 is a set of super capacitors. Herein, a set of the super capacitors may be configured as the combination of at least one serially-connected super capacitors and parallel-connected super capacitors. In FIG. 6, for convenience, the super capacitor array 522 has a structure in which four pairs of serially-connected super capacitors are connected in parallel.

The super capacitor charger 524 receives a power from the external power source 510 to charge the super capacitor array 522. The output terminal of the super capacitor charger 524 includes a one-way device D.

Each of the super capacitor boosters 531 to 533 receives the output voltage of the super capacitor array 522 via a parallel circuit arrangement and boosts the received voltage to a power source voltage VCC, and thereafter supplies the power source voltage VCC to a corresponding power line among the power lines PWL1 to PWL3. In an embodiment of the general inventive concept, the output voltage of the super capacitor array 522 may be a voltage from 0 V to 3.6 V. The output terminal of each of the super capacitor boosters 531 to 533 includes a one-way device D.

Each of the voltage detectors 541 to 543 detects whether the voltage of a corresponding power line among the power lines PWL1 to PWL3 is lower than a predetermined voltage. At this point, the detected result values of the voltage detectors 541 to 543 are connected by wired-oring, thereby generating a reset signal nRST.

The first power domain 550 receives the power source voltage VCC from the first power line PWL1. The first power domain 550 includes first and second voltage regulators 551 and 552, a CPU 553, and at least one DRAM 554. Voltage detector 541, voltage regulator 551 and voltage regulator 552 are connected in parallel.

The first voltage regulator 551 receives the power source voltage VCC from the first power line PWL1 to generate a first driving voltage VDD1 necessary to drive the CPU 553. In an embodiment of the general inventive concept, the first driving voltage VDD1 may be about 1.2 V.

The second voltage regulator 552 receives the power source voltage VCC from the second power line PWL1 to generate a second driving voltage VDD2 necessary for the at least one DRAM 554. In an embodiment of the general inventive concept, the second driving voltage VDD2 may be about 1.8 V.

The CPU 553 receives the first driving voltage VDD1 from the first voltage regulator 551 to control the overall operation of the SSD 500. The CPU 553 receives a command from the outside to determine whether to store data in at least one first and second NANDs 565 and 575 or whether to read data from the at least one first and second NANDs 565 and 575, and performs control. The CPU 553 performs a reset operation in response to the reset signal nRST.

A reset operation performed by the CPU 553 upon receiving the reset signal nRST may be an operation to cease a write or read operation to an end. This may be done in order to prevent a write or read operation from being prematurely terminated due to power loss from the external power source 510 and auxiliary power sources.

The at least one DRAM 554 receives a second driving voltage VDD2 from the second voltage regulator 552, and may temporarily store data that is generated when data is inputted/outputted to/from the at least one NANDs 565 and 575 or may store temporary data that is generated in operating of the CPU 553. Upon receipt of the reset signal nRST, the CPU may direct the information temporarily stored in the DRAM 554 to be erased, properly transmitted, or permanently written to one of the plurality of NANDs before power loss drops below a first predetermined level.

The second power domain 560 receives the power source voltage VCC from the second power line PWL2. The second power domain 560 includes a voltage regulator 561, and the at least one first NAND 565.

A second voltage detector 542 is connected in parallel with the second power domain 560. The second voltage detector 542 may detect a power loss in second power line PWL2. Similar to voltage detectors described in other exemplary embodiments herein, the second voltage detector 542 may detect a drop in power from the second power line PWL2 to less than a second predetermined voltage, and send a VLow signal to the CPU 553. Upon receipt of such a signal, the CPU 553 may control the super capacitor array 522 to supplement the voltage supplied across the second power line PWL2 or all of the power lines PWL1 to PWLk.

The second voltage detector 542 may also monitor voltage transmitted along the second power line PWL2 to determine if a voltage level is below a first predetermined voltage level that is less than the second predetermined voltage level. Upon making this determination, the second voltage detector may generate and transmit the reset signal nRST to the CPU 553.

The voltage regulator 561 receives the power source voltage VCC from the second power line PWL2 to generate a third driving voltage VDD3 to drive the first NAND 565. In an embodiment of the general inventive concept, the third driving voltage VDD3 may be about 3.3 V.

The at least one first NAND 565 may be a NAND flash memory device that receives the third driving voltage VDD3 from the voltage regulator 561 and stores data. In an embodiment of the general inventive concept, the at least one first NAND 565 may be a single-level cell NAND non-volatile flash memory device. In another embodiment of the general inventive concept, the at least one first NAND 565 may be a multi-level cell NAND non-volatile flash memory device.

The third power domain 570 receives the power source voltage VCC from the third power line PWL3. The third power domain 570 includes a voltage regulator 571, and the at least one second NAND 575.

The third voltage detector 543 is connected in parallel with the third power domain 570. The third voltage detector 543 is structured to perform in a similar manner as the second voltage detector 542. The general inventive concept is not limited to three voltage detectors and three power domains, but may have up to k voltage detectors and power domains, with k being a number equal to or greater than two.

The voltage regulator 571 receives the power source voltage VCC from the third power line PWL3 to generate a third driving voltage VDD3 to drive the second NAND 575.

The at least one first NAND 575 may be a non-volatile NAND flash memory device that receives the third driving voltage VDD3 from the voltage regulator 571 and stores data.

The SSD 500 according to an embodiment of the general inventive concept may further include a cell balancing circuit (not illustrated) to prevent the deterioration of a super capacitor and extending the service life of the super capacitor.

in FIG. 6, the number of the power domains 550, 560 and 570 is three. However, the general inventive concept is not limited thereto. The SSD according to an embodiment of the general inventive concept includes at least two power domains.

A typical SSD monitors only a power domain including a CPU. Since a conventional SSD does not monitor voltage or power supplied to other power domains, there is a relatively high possibility that data matchability in sudden power-off will be limited in the other power domains when a power source is shut off.

On the other hand, the SSD 500 according to an embodiment of the general inventive concept detects the voltages of the power lines PWL1 to PWLk connected to all power domains to generate a reset signal nRST when voltages fall below a predetermined level, and thus can enhance reliability relevant to Sudden Power-Off Recovery (SPOIL) when the external power source 510 is shut off. Accordingly, reliability of data improves.

Figure 7:
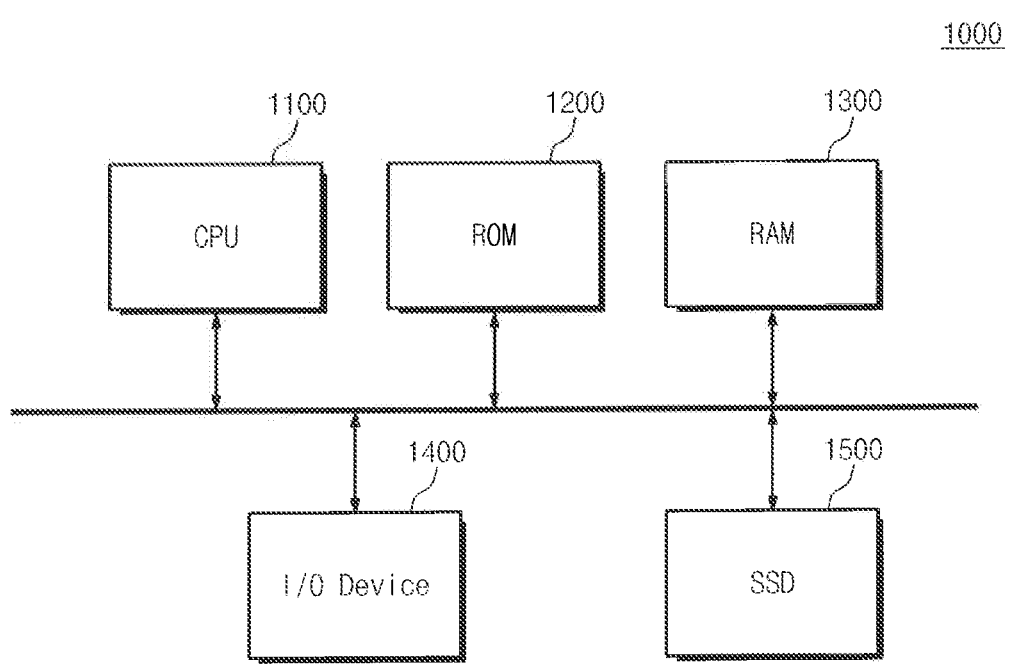
FIG. 7 is a block diagram illustrating a computer system according to an embodiment of the general inventive concept.

FIG. 7 is a block diagram illustrating a computer system 1000 according to an embodiment of the general inventive concept.

Referring to FIG. 7, the computer system 1000 includes a CPU 1100, a ROM 1200, a RAM 1300, an input/output device 1400, and an SSD 1500.

The CPU 1100 is connected to a system bus. The ROM 1200 stores data necessary to drive of the computer system 1000. As such data, there is an initial command sequence or a Basic Input/Output Operation System (BIOS) sequence. The RAM 1300 temporarily stores data that is generated when the CPU 1100 is executed.

In an embodiment of the general inventive concept, the input/output device 1400, which may include a keyboard, a pointing device (for example, mouse), a monitor, a modem, etc., is connected to the system bus through an input/output device interface.

As a readable storage device, the SSD 1500 is implemented identically to the SSD 500 of FIG. 6.

The computer system 1000 according to an embodiment of the general inventive concept stores large-scale data in the SSD 1500 being a nonvolatile memory device, thereby reducing power consumption. Accordingly, the computer system 1000 can largely increase the use time of a battery.

Figure 8:
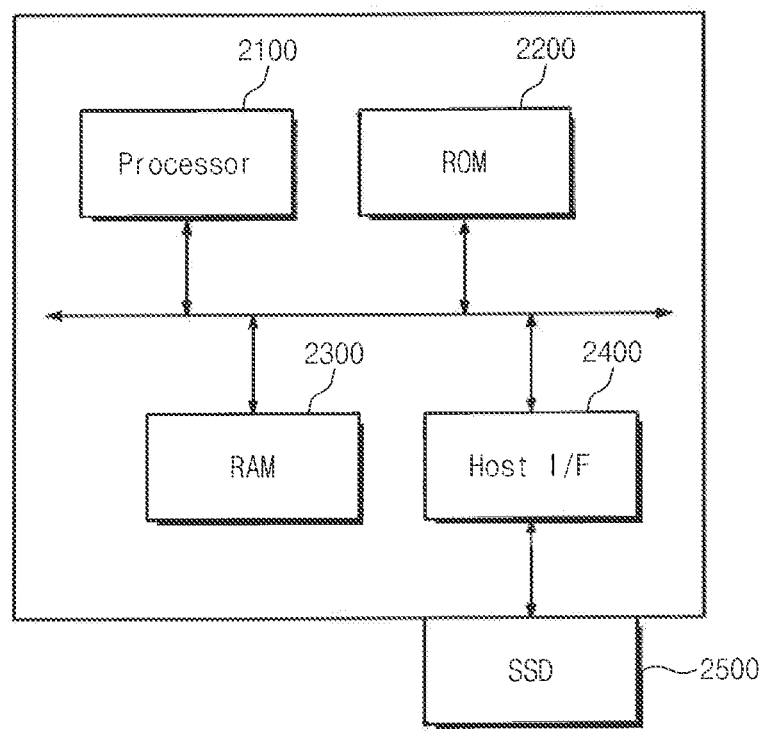
FIG. 8 is a block diagram illustrating an electronic device according to an embodiment of the general inventive concept.

FIG. 8 is a block diagram illustrating an electronic device 2000 according to an embodiment of the general inventive concept.

Referring to FIG. 8, the electronic device 2000 according to an embodiment of the general inventive concept includes a processor 2100, a ROM 2200, a RAM 2300, a flash interface 2400, and an SSD 2500.

The processor 2100 accesses the RAM 2300 to execute a firmware code or an arbitrary code. Also, the processor 2100 accesses the ROM 2200 to execute fixed command sequences such as an initial command sequence or BIOS sequences. The flash interface 2400 performs interfacing between the electronic device 2000 and the SSD 2500.

The SSD 2500 is attachable/detachable to/from the electronic device 2000. The SSD 2500 is implemented identically to the SSD 500 of FIG. 6.

The electronic device 2000 according to an embodiment of the general inventive concept may be a cellular phone, a PDA, a digital camera, a camcorder, a portable audio replay device (for example, MP3) or a PMP.

The electronic device 2000 according to an embodiment of the general inventive concept stores large-scale data in the SSD 2500 being a nonvolatile memory device, thereby reducing power consumption. Accordingly, the electronic device 2000 is easy to carry.

Figure 9:
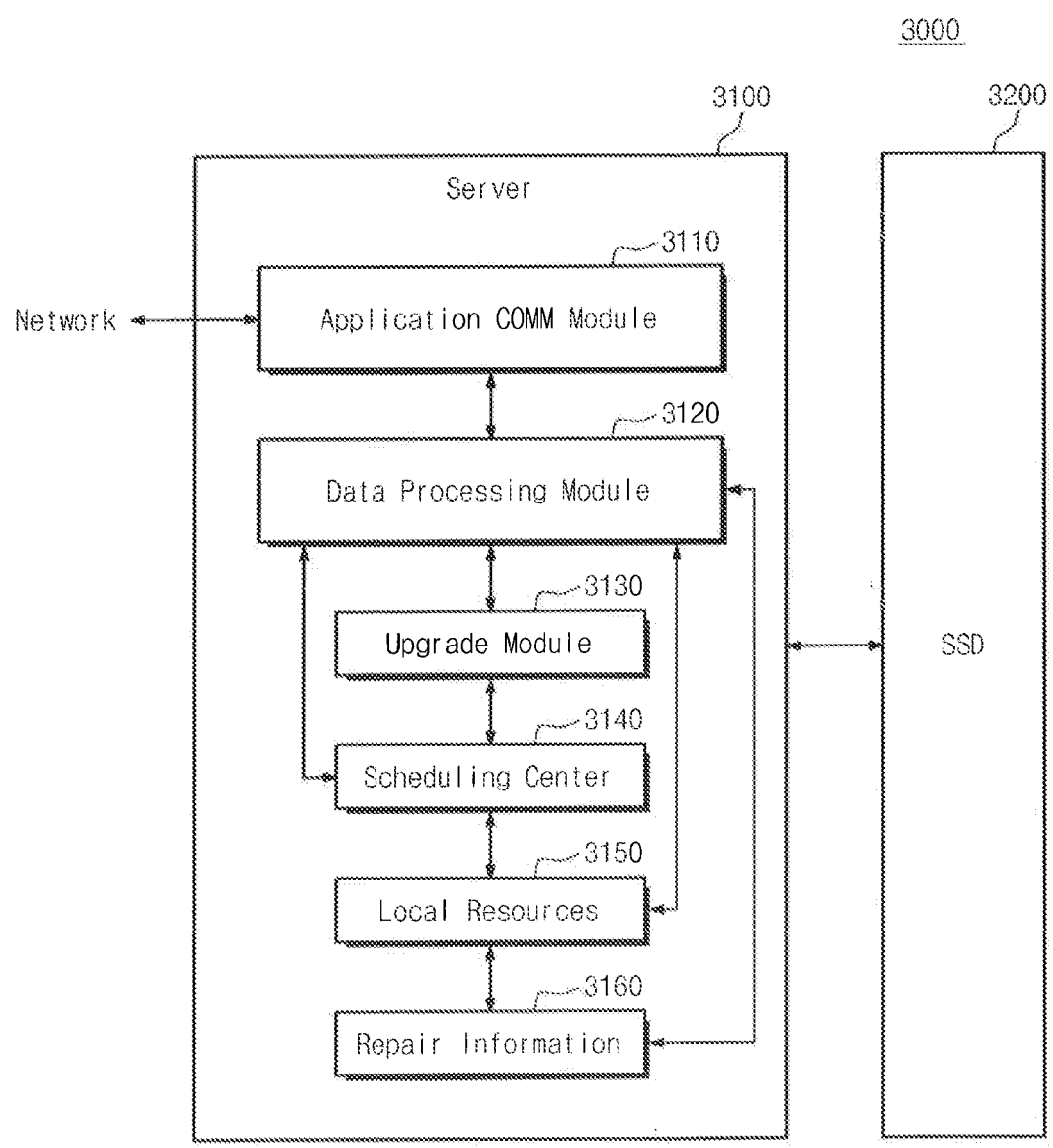
FIG. 9 is a block diagram illustrating a server system according to an embodiment of the general inventive concept.

FIG. 9 is a block diagram illustrating a server system 3000 according to an embodiment of the general inventive concept.

Referring to FIG. 9, the server system 3000 includes a server 3100 and an SSD 3200 that stores data necessary to drive the server 3100. Herein, the SSD 3200 is implemented to have the same configuration and operation as those of the SSD 500 of FIG. 6.

The server 3100 includes an application communication module 3110, a data processing module 3120, an upgrade module 3130, a scheduling center 3140, a local resource module 3150, and a repair information module 3160.

The application communication module 3110 communicates with a computer system that is connected to the server 3100 over a network or allows the sever 3100 to communicate with the SSD 3200. The application communication module 3110 transmits data or information, which is received through a user interface, to the data processing module 3120.

The data processing module 3120 is linked to the local resource module 3150. Herein, the local resource module 3150 provides a list of repair shops/dealers/technical information to a user, on the basis of data or information that is inputted to the server 3100.

The upgrade module 3130 interfaces with the data processing module 3120. The upgrade module 3130 upgrades a firmware, a reset code, diagnosis system upgrade or other information in an appliance, on the basis of data or information that is transmitted from the SSD 3200.

The scheduling center 3140 allows a real-time option to a user on the basis of data or information that is inputted to the server 3100.

The repair information module 3160 interfaces with the data processing module 3120. The repair information module 3160 is used to provide repair-related information (for example, audio, video, or document file) to a user. The data processing module 3120 packages relevant information on the basis of information that is transferred from the SSD 3200. Subsequently, such information is transmitted to the SSD 3200 or is displayed to the user.

The server system 3000 according to an embodiment of the general inventive concept includes the SSD 3200 that has been enhanced in SPOR reliability, largely enhancing reliability of data.

In addition, the server system 3000 stores data in the SSD 3200 from which stored data is not erased even when a power is shut off, and thus can considerably reduce power consumption compared to a case of using a Hard Disk Driver (HDD).

The memory system or the memory device according to embodiments of the general inventive concept may be mounted with various types of packages. For example, the memory system or the memory device according to embodiments of the general inventive concept may be mounted with packages such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (ESOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP).

As described above, the memory system and the reset method thereof according to embodiments of the general inventive concept detect the voltages of all the power lines to generate the reset signal, and thus can enhance reliability of data when the power is shut off.

The above-disclosed subject matter is to be considered illustrative and not restrictive, and the appended claims are intended to cover all such modifications, enhancements, and other embodiments, which fall within the spirit and scope of the general inventive concept. Thus, to the maximum extent allowed by law, the scope of the general inventive concept is to be determined by the broadest permissible interpretation of the following claims and their equivalents, and shall not be restricted or limited by the foregoing detailed description.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A memory system including at least one nonvolatile memory device, the memory system comprising:
   a plurality of power lines to receive a power source voltage;
   a plurality of power domains respectively connected to the power lines;
   a plurality of voltage detectors to respectively detect the power lines;
   a plurality of power boosters respectively to boost an output voltage of a charge cell array and to apply the boosted voltage to a corresponding power line among the power lines such that each of the plurality of power boosters respectively powers a separate power domain of the plurality of power domains; and
   a reset signal generator to detect voltages from the plurality of power lines and to generate a power-off reset signal to at least a first power domain of a plurality of power domains when at least one of the detected voltages is lower than a first predetermined voltage and supplemental power provided to the plurality of the power lines is not able to maintain a second predetermined voltage and the first predetermined voltage, wherein the at least first power domain of the plurality of power domains comprises a Central Processing Unit (CPU) to perform a power-off reset operation in response to the power-off reset signal so as to turn off write and read operations of the plurality of power domains, other than the at least first power domain, that are in a process of accessing memory devices, the power-off reset signal being generated by the reset signal generator by connecting detected result values outputted from the plurality of voltage detectors by wired-OR circuitry,
   wherein the charge cell array comprises at least one charge cell which charges electric charges.

2. The memory system of claim 1, wherein each of the voltage detectors comprises a CMOS transistor.

3. The memory system of claim 1, wherein each of the voltage detectors comprises an open-drain transistor.

4. The memory system of claim 1, further comprising:
   an external power source to receive an external power to supply the power source voltage to the power lines.

5. The memory system of claim 4, further comprising:
   a battery to auxiliarily supply the power source voltage to the power lines.

6. The memory system of claim 4, further comprising:
   an auxiliary power supply to receive the power source voltage from the external power source to supply the power source voltage to the power lines.

7. The memory system of claim 6, wherein the auxiliary power supply comprises:
   a power charger to receive the power source voltage from the external power source to charge the electric charges in the charge cell array.

8. The memory system of claim 7, wherein the at least one charge cell is a super capacitor which charges large-scale electric charges.

9. The memory system of claim 7, wherein the power charger comprises an output terminal comprising a one-way device.

10. A memory system including at least one nonvolatile memory device, the memory system comprising:
    a plurality of power domains to receive a power source voltage through a plurality of power lines, respectively;
    an auxiliary power supply to supply the power source voltage to the power lines when a power is shut off; and
    a plurality of voltage detectors to respectively detect voltages of the plurality of power lines and to generate, when the voltages which are detected by the plurality of voltage detectors are lower than a first predetermined voltage and supplemental power provided to the plurality of the power lines is not able to maintain a second predetermined voltage and the first predetermined voltage, a power-off reset signal to a first power domain of the plurality of power domains, the power-off reset signal being generated by connecting detected result values outputted from the plurality of voltage detectors by wired-OR circuitry,
    wherein, at least the first power domain of the plurality of power domains comprises a Central Processing Unit (CPU) to perform a power-off reset operation in response to the power-off reset signal so as to turn off write and read operations of the plurality of power domains, other than the first power domain, that are in a process of accessing memory devices,
    wherein an auxiliary power supply comprises:
      a super capacitor array comprising at least one serially-connected super capacitor;
      a super capacitor charger to charge the super capacitor array; and
      a plurality of super capacitor boosters respectively to boost an output voltage of the super capacitor array to the power source voltage, and to supply the boosted power source voltage to the plurality of power lines, respectively, such that each of the plurality of power boosters respectively powers a separate power domain of the plurality of power domains.

11. The memory system of claim 10, wherein the output voltage of the super capacitor array is equal to or lower than about 3.6 V.

12. The memory system of claim 10, wherein each of the power domains comprises at least one driving regulator to receive the power source voltage from a corresponding power line to generate at least one driving voltage to drive of an internal device which is comprised in a power domain.

13. The memory system of claim 12, further comprising: a plurality of NAND flash memory devices storing data,
    wherein the NAND flash memory devices are divided into at least two groups among the power domains.

14. A reset method of a memory system including at least one nonvolatile memory device and at least one Central Processing Unit (CPU), the reset method comprising:
    boosting an output voltage of a charge cell array at a plurality of power boosters respectively;
    applying the boosted voltage from each of the plurality of power boosters to a corresponding power line among a plurality of power lines so as to respectively power separate power domains of a plurality of power domains;
    detecting voltages of the plurality of power lines which are respectively connected to the plurality of power domains with a plurality of voltage detectors, respectively;
    generating a power-off reset signal when at least one of the detected voltages is lower than a first predetermined voltage and supplemental power provided to the plurality of the power lines is not able to maintain a second predetermined voltage and the first predetermined voltage, the power-off reset signal being generated by connecting detected result values outputted from the plurality of voltage detectors by wired-OR circuitry, where the power-off reset signal is output to a first power domain of the plurality of power domains, the first power domain having the at least one CPU; and resetting the at least one CPU in response to the power-off reset signal so as to turn off write and read operations of the plurality of power domains, other than the first power domain, that are in a process of accessing memory devices.

15. The reset method of claim 14, wherein the reset signal is used for a sudden power-off recovery operation of the at least one nonvolatile memory device.

16. A memory system, comprising:

at least one power source to supply power to the memory system;

a plurality of voltage detectors to detect a voltage level output from the at least one power source via a plurality of power lines;

a plurality of power boosters respectively to boost an output voltage for a charge cell array and to apply the boosted voltage to a corresponding power line among the power lines such that each of the plurality of power boosters respectively powers a separate power domain of a plurality of power domains;

a first power domain of the plurality of power domains including a non-volatile memory device; and a second power domain of the plurality of power domains including a processor to control the operation of the non-volatile memory device depending on the detected voltage level from at least one of the plurality of voltage detectors, wherein at least one of the plurality of voltage detectors outputs a power-off reset signal to the processor when power output from the at least one power source is below a first predetermined level and supplemental power provided to the plurality of the power lines is not able to maintain a second predetermined level and the first predetermined level so as to turn off write and read operations of power domains, other than the second power domain, that are in a process of accessing memory devices, the power-off reset signal being generated by connecting detected result values outputted from the plurality of voltage detectors by wired-OR circuitry.

17. The memory system of claim 16, wherein at least one of the plurality of voltage detectors outputs a voltage low (VLow) signal to the processor when power output from the at least one power source is below the second predetermined level and higher than the first predetermined level.

18. The memory system of claim 17, further comprising:

a second power source to supply power to the memory system after the at least one of the plurality of voltage detectors outputs the VLow signal.

* * * * *